(12) United States Patent
Lewis et al.

(10) Patent No.: US 9,545,612 B2
(45) Date of Patent: *Jan. 17, 2017

(54) SOLAR FUEL GENERATOR

(71) Applicant: California Institute of Technology, Pasadena, CA (US)

(72) Inventors: Nathan S. Lewis, La Canada Flintridge, CA (US); William C. West, Aichi (JP)

(73) Assignee: California Institute of Technology, Pasadena, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 13/740,185

(22) Filed: Jan. 12, 2013

(65) Prior Publication Data

US 2015/0056109 A1 Feb. 26, 2015

Related U.S. Application Data

(60) Provisional application No. 61/586,621, filed on Jan. 13, 2012.

(51) Int. Cl.
| | |
|---|---|
| *B01J 19/12* | (2006.01) |
| *H01G 9/20* | (2006.01) |
| *H01L 31/02* | (2006.01) |
| *H01M 14/00* | (2006.01) |
| *H01L 31/0216* | (2014.01) |

(52) U.S. Cl.
CPC ........... *B01J 19/123* (2013.01); *H01G 9/2059* (2013.01); *H01L 31/02167* (2013.01); *H01M 14/005* (2013.01); *Y02E 10/50* (2013.01)

(58) Field of Classification Search
CPC .. B01J 19/123; H01G 9/2059; H01L 31/0267; H01M 14/005; Y02E 10/50

USPC ......... 422/186–187, 222, 310; 205/339–340; 502/4

See application file for complete search history.

(56) References Cited

U.S. PATENT DOCUMENTS

| | | | |
|---|---|---|---|
| 4,888,101 A | * | 12/1989 | Cooper .................. B01J 19/122 422/186 |
| 5,314,569 A | | 5/1994 | Pribat |
| 5,336,558 A | | 8/1994 | Debe |
| 5,352,651 A | | 10/1994 | Debe |
| 5,468,699 A | * | 11/1995 | Zhang et al. ..................... 502/4 |

(Continued)

FOREIGN PATENT DOCUMENTS

| | | |
|---|---|---|
| CN | 1669920 A | 9/2005 |
| CN | 1808688 A | 7/2006 |

(Continued)

OTHER PUBLICATIONS

Lepiller et al., "New Facets of CdTe Electrodeposition in Acidic Solutions with Higher Tellurium Concentrations", Journal of the Electrochemical Society, 151 (5) C348-C357, 2004.

(Continued)

*Primary Examiner* — Keith Hendricks
*Assistant Examiner* — Colleen M Raphael
(74) *Attorney, Agent, or Firm* — Joseph R. Baker, Jr.; Gavrilovich, Dodd & Lindsey LLP

(57) ABSTRACT

The disclosure provides conductive membranes for water splitting and solar fuel generation. The membranes comprise an embedded semiconductive/photoactive material and an oxygen or hydrogen evolution catalyst. Also provided are chassis and cassettes containing the membranes for use in fuel generation.

10 Claims, 4 Drawing Sheets

(56) References Cited

U.S. PATENT DOCUMENTS

| | | | |
|---|---|---|---|
| 5,834,069 A * | 11/1998 | Berman | B01J 19/122 422/186.3 |
| 5,976,957 A | 11/1999 | Westwater et al. | |
| 6,306,734 B1 | 10/2001 | Givargizov | |
| 6,649,824 B1 | 11/2003 | Den | |
| 7,057,881 B2 | 6/2006 | Chow et al. | |
| 7,105,428 B2 | 9/2006 | Pan et al. | |
| 7,109,517 B2 | 9/2006 | Zaidi | |
| 7,116,546 B2 | 10/2006 | Chew | |
| 7,148,417 B1 | 12/2006 | Landis | |
| 7,238,594 B2 | 7/2007 | Fonash et al. | |
| 7,253,017 B1 | 8/2007 | Roscheisen et al. | |
| 7,253,442 B2 | 8/2007 | Huang | |
| 7,309,620 B2 | 12/2007 | Fonash et al. | |
| 7,335,259 B2 | 2/2008 | Hanrath et al. | |
| 7,560,366 B1 | 7/2009 | Romano et al. | |
| 7,666,708 B2 | 2/2010 | Lieber et al. | |
| 8,105,474 B2 * | 1/2012 | Fan | 205/340 |
| 2002/0172820 A1 | 11/2002 | Majumdar et al. | |
| 2003/0230337 A1 * | 12/2003 | Gaudiana | H01G 9/2031 136/256 |
| 2005/0205128 A1 | 9/2005 | Deng et al. | |
| 2005/0253138 A1 | 11/2005 | Choi et al. | |
| 2005/0279274 A1 | 12/2005 | Niu et al. | |
| 2006/0118791 A1 | 6/2006 | Leu et al. | |
| 2006/0207647 A1 | 9/2006 | Tsakalakos et al. | |
| 2007/0119706 A1 | 5/2007 | McNulty | |
| 2007/0122313 A1 | 5/2007 | Li et al. | |
| 2007/0166899 A1 | 7/2007 | Yao et al. | |
| 2007/0278476 A1 | 12/2007 | Black | |
| 2008/0047604 A1 | 2/2008 | Korevaar et al. | |
| 2008/0075954 A1 | 3/2008 | Wardle et al. | |
| 2008/0110486 A1 | 5/2008 | Tsakalakos et al. | |
| 2008/0134089 A1 | 6/2008 | Tsakalakos et al. | |
| 2008/0169017 A1 | 7/2008 | Korevaar et al. | |
| 2008/0315430 A1 | 12/2008 | Weber et al. | |
| 2009/0020150 A1 | 1/2009 | Atwater et al. | |
| 2009/0020853 A1 | 1/2009 | Kayes et al. | |
| 2009/0026070 A1 | 1/2009 | Fan et al. | |
| 2009/0050204 A1 | 2/2009 | Habib | |
| 2009/0057839 A1 | 3/2009 | Lewis et al. | |
| 2009/0065048 A1 | 3/2009 | Dasgupta et al. | |
| 2009/0127540 A1 | 5/2009 | Taylor | |
| 2009/0152527 A1 | 6/2009 | Lee et al. | |
| 2009/0266411 A1 | 10/2009 | Habib et al. | |
| 2011/0278176 A1 | 11/2011 | He | |
| 2012/0138456 A1 | 6/2012 | Spurgeon et al. | |

FOREIGN PATENT DOCUMENTS

| | | |
|---|---|---|
| JP | 11-214720 | 8/1999 |
| JP | 2005-310388 | 4/2005 |
| JP | 2005-194609 | 7/2005 |
| JP | 2011-116581 A | 6/2011 |
| KR | 10-2007-18457 | 2/2007 |
| WO | 03/005450 A2 | 1/2003 |
| WO | 2006/138671 A2 | 12/2006 |
| WO | 2007066087 A2 | 6/2007 |
| WO | 2008/135905 A2 | 11/2008 |
| WO | 2010/37014 A2 | 12/2010 |

OTHER PUBLICATIONS

Lin et al., Efficient photoinduced charge transfer in TiO2 nanorod/conjugated polymer hybrid materials, Nanotechnology, 17 (2006), 5781-5785.

Lombardi et al., "Synthesis of High Density, Size-Controlled Si Nanowire Arrays via Porous Anodic Alamina Mask", Chem. Mater., 2006, 18, 988-991.

Maiolo et al., "High Aspect Ratio Silicon Wire Array Photoelectrochemical Cells", J. Am. Chem. Soc., 129, 2007, 12346-12347.

Maiolo et al., "Macroporous Silicon as a Model for Silicon Wire Array Solar Cells", J. Phys. Chem. C 2008, 112, 6194-6201.

Martensson et al., "Fabrication of individually seeded nanowire arrays by vapour-liquid-solid growth", Nanotechnology, 14 (2003) 1255-1258.

Mccandless et al., "Cadmium Telluride Solar Cells", In Handbook of Photovoltaic Science and Engineering, 2003, pp. 617-657.

McDonald et al., "Poly(dimethylsiloxane) as a Material for Fabricating Microfluidic Devices", Acc. Chem. Res., 2002, 35 (7), 491-499.

Meissner et al., "Light-Induced Generation of Hydrogen at CdS-Monograin Membranes", Chemical Physics Letters, vol. 96, No. 1, Mar. 25, 1983, pp. 34-37.

Mohan et al., "Controlled growth of highly uniform, axial/radial direction-defined, individually addressable InP nanowire arrays", Nanotechnology 16 (2005) 2903-2907.

Morales et al., "A Laser Ablation Method for the Synthesis of Crystalline Semiconductor Nanowires", Science, 79, 208-211 (1998).

Morin et al., "Biomimetic Assembly of Zinc Oxide Nanorods onto Flexible Polymers", J. Am. Chem. Soc., 2007, 129 (45), 13776-13777.

Nickitas-Etienne, Athina, International Preliminary Report on Patentability, PCT/US2013/021339, The International Bureau of WIPO, Date of Mailing: Jul. 24, 2014.

Park, Jae Hun, Search Report for PCT/US2008/070495, Korean Intellectual Property Office, Date of Mailing: Feb. 20, 2009.

Park, Jae Hun, Written Opinion for PCT/US2008/070495, Korean Intellectual Property Office, Date of Mailing: Feb. 20, 2009.

Park, Jae Hun, Search Report for PCT/US2008/070523, Korean Intellectual Property Office, Date of Mailing: Feb. 20, 2009.

Park, Jae Hun, Written Opinion for PCT/US2008/070523, Korean Intellectual Property Office, Date of Mailing: Feb. 20, 2009.

Park, Jae Hun, Search Report for PCT/US2008/070518, Korean Intellectual Property Office, Date of Mailing: Feb. 20, 2009.

Park, Jae Hun, Written Opinion for PCT/US2008/070518, Korean Intellectual Property Office, Date of Mailing: Feb. 20, 2009.

Paulson et al., "Spectroscopic ellipsometry investigation of optical and interface properties of CdTe films deposited on metal foils", Solar Energy Materials & Solar Cells, 82 (2004) 279-90.

Peng et al., "Fabrication of Large-Area Silicon Nanowire p-n Junction Diode Arrays", Adv. Mater., 2004, 16 (1), 73-76.

Peng et al., "Aligned Single-Crystalline Si Nanowire Arrays for Photovoltaic Applications", Small, 2005, 1, 1062-1067.

Pushparaj et al., "Flexible energy storage devices based on nanocomposite paper", PNAS, Aug. 21, 2007, vol. 104, No. 34, pp. 13574-13577.

Raravikar et al., "Embedded Carbon-Nanotube-Stiffened Polymer Surfaces", Small, 1 (3), 317 (2005).

Rosenbluth et al., "630-mV open circuit voltage, 12% efficient n-Si liquid junction", Appl. Phys. Lett, 1985, 45, 423-425.

Rosenbluth et al., "Kinetic Studies of Carrier Transport and Recombination at the n-Silicon/Methanol Interface", Journal of the American Chemical Society, vol. 108, No. 16, Aug. 6, 1986, pp. 4689-4695.

Rosenbluth et al., "'Ideal' Behavior of the Open Circuit Voltage of Semiconductor/Liquid Junctions", 1989, 93, 3735-3740.

Routkevitch et al., "Electrochemical Fabrication of CdS Nanowire Arrays in Porous Anodic Aluminum Oxide Templates", J. Phys. Chem. 1996, 100, 14037-14047.

Sansom et al., "Controlled partial embedding of carbon nanotubes within flexible transparent layers", Nanotechnology, 19, 035302 (2008).

Schmidt et al., "Diameter-Dependent Growth Direction of Epitaxial Silicon Nanowires", Nano Letters, 2005, vol. 5, No. 5, 931-935.

Shchetin et al., "Photoconverters Based on Silicon-Crystal Whiskers", Translated from Izmeritarnaya Teknika, No. 4, pp. 35-36, 1978.

Shimizu et al., "Synthesis of Vertical High-Density Epitaxial Si(100) Nanowire Arrays on a Si(100) Substrate Using an Anodic Aluminum Oxide Template", Advanced Materials, 19, 917-920 (2007).

(56) References Cited

OTHER PUBLICATIONS

Struthers, J.D., "Solubility and Difusivity of Gold, Iron, and Copper in Silicon", J. Appl. Phys, 27, 1956, p. 1560.
Sunden et al., "Microwave assisted patterning of vertically aligned carbon nanotubes onto polymer substrates", J. Vac. Sci. Technol. B 24(40 Jul./Aug. 2006, pp. 1947-1950.
Sze, M., "Physics of Semiconductor Devices", 2nd Edition, Wiley, New York, 1981, p. 21.
Thai, Luan C., Non-Final Office Action, U.S. Appl. No. 12/176,100, USPTO, Jan. 6, 2010.
Tsakalakos et al., "Silicon nanowire solar cells", Applied Physics Letters, 91, 2007, 233117-1-233117-3.
Tsakalakos et al., "Strong broadband optical absorption in silicon nanowire films", J. of Nanophotonics, 2007, 1 , 013552-1-013552-10.
Wagner et al., "Vapor-Liquid-Solid Mechanism of Single Crystal Growth", Applied Physics Letters, Mar. 1, 1964, vol. 4, No. 5, pp. 89-90.
Wagner et al., "The Vapor-Liquid-Solid Mechanism of Crystal Growth and Its Application to Silicon", Trans. Metal. Soc. AIME, 1965, 233 (6), 1053-1064.
Westvvater et al., "Control of the Size and Position of Silicon Nanowires Grown via the Vapor-Liquid-Solid Technique", Jpn. J. Appl. Phys., vol. 36 (1997) pp. 6204-6209.
Woodruff et al., "Vertically Oriented Germanium Nanowires Grown from Gold Colloids on Silicon Substrates and Subsequent Gold Removal", Nano Letters, 2007, vol. 7, No. 6, 1637-1642.
Wu et al., "A Study on Deep Etching of Silicon Using Ethylene-Diamine-Pyrocatechol-Water", Sensors and Actuators, 9 (1986) 333-343.
Wu et al., "Semiconductor nanowire array: potential substrates for photocatalysis and photovoltaics", Topics in Catal., 2002, 19 (2), 197-202.
Xia et al., "One-Dimensional Nanostructures: Synthesis, Characterization, and Applications", Adv. Mater., 2003, 15(5), 353-389.
Yang et al., "Experimental Observation of an Extremely Dark Material by a Low-Density Nanotube Array", Nano Letters, 2008, vol. 8, No. 2, 446-451.
Yao et al., "Si nanowires synthesized with Cu catalyst", Materials Letters, 61 (2007), pp. 177-181.
Yu et al., "Silicon Nanowires: Preparation, Device Fabrication, and Transport Properties", J. Phys. Chem. B 2000, 104, 11864-11870.
Yu et al., "Large-area blown bubble films of aligned nanowires and carbon nanotubes", Nat. Nanotechnol., 2007, 2 (6) 372-377.
Zach et al., "Synthesis of Molybdenum Nanowires with Millimeter-Scale Lengths Using Electrochemical Step Edge Decoration", Chem. Mater. 2002, 14, 3206-3216.
Basol et al., "Ultra-Thin Electrodeposited CdS/CdTe Heterojunction with 8% Efficiency", IEEE Photo. Spec. Conf., 1982, 805-808.
Basol, B., "High-efficiency electroplated heterojunction solar cell", J. Appl. Phys. 55(2), 1984, pp. 601-603.
Basol, B., "Thin Film CdTe Solar Cells—A Review", Conf. Rec. IEEE Photo. Spec. Conf., 1990, 588-594.
Bhattacharya et al., "Electrodeposition of CdTe Thin Films", 1984, 131, 2032-2041.
Bogart et al., "Diameter-Controlled Synthesis of Silicon Nanowires Using Nanoporous Alumina Membranes", Adv. Mater. 2005, 17 (1), 114-117.
Bullis, W.M., "Properties of Gold in Silicon", Solid-State Electronics, Pergamon Press, 1966, vol. 9, pp. 143-168.
Choi, Jeong Yoon, Search Report for PCT/US2008/070509, Korean Intellectual Property Office, Date of Mailing: Feb. 20, 2009.
Choi, Jeong Yoon, Written Opinion for PCT/US2008/070509, Korean Intellectual Property Office, Date of Mailing: Feb. 20, 2009.
Chu et al., "Large Area Polycrystalline Silicon Solar Cells on Unidirectionally Solidified Acid-Treated Metallurigcal Grade Silicon", Proc. IEEE Southeastcon, 1989, 1436-1441.
Davis, Jr. et al., "Impurities in Silicon Solar Cells", IEEE Transactions on Electron Devices, vol. ED-27, No. 4, Apr. 1980, 677.

de Dood, Michiel Jacob Andries, "Silicon photonic crystals and spontaneous emission", Thesis, Utrecht University, 2002.
Erts et al., "High Density Germanium Nanowire Assemblies: Contact Challenges and Electrical Characterization", J. Phys. Chem. B2006, 110, 820-826.
Fan et al., "Semiconductor Nanowires: From Self-Organization to Patterned Growth", Small 2(6), 700-717 (2006).
Fan et al., "Well-ordered ZnO nanowire arrays on GaN substrate fabricated via nanosphere lithography", Journal of Crystal Growth, 287 (2006) 34-38.
Fulop et al., "High-efficiency electrodeposited cadmium telluride solar cells", Appl. Phys. Lett., 1982, 40, 327-328.
Gibbons et al., "A 14% efficient nonaqueous semiconductor/liquid junction solar cell", Appl. Phys. Lett., 1984, 45, 1095-1097.
Givargizov, "Growth of Whiskers from the Vapor Phase", Highly Anisotropic Crystals, D. Reidel, Dordrecht, Holland, 1987, p. 169.
Goodey et al., "Silicon Nanowire Array Photoelectrochemical Cells", J. Am. Chem. Soc., 2007, 129 (41), 12344-12345.
Gowrishankar et al., "Fabrication of densely packed, well-ordered, high-aspect-ratio silicon nanopillars over large areas using block copolymer lithography", Thin Solid Films, 2006, 513, 289-294.
Gronet et al., "n-Type silicon photoelectrochemistry in methanol: Design of a 10.1% efficient semiconductor/liquid junction solar cell", Proc. Natl. Acad. Sci. USA, vol. 80, pp. 1152-1156, Feb. 1983.
Gstrein et al., "Effects of Interfacial Energetics on the Effective Surface Recombination Velocity of Si/Liquid Contacts", J. Phys. Chem., B2002, 106, 2950-2961.
Gu et al., "Quantitative Measurement of the Electron and Hole Mobility-Lifetime Products in Semiconductor Nanowires", Nano Letters, 2006, vol. 6, No. 5, 948-952.
Guo, L. Jay, "Nanoimprint Lithography: Methods and Material Requirements", Advanced Materials, 19, 495-513, 2007.
Haick et al., "Electrical Characteristics and Chemical Stability of Non-Oxidized, Methyl-Terminated Silicon Nanowires", J. Am. Chem. Soc., 2006, 128, 8990-8991.
Harris et al., "Semiconductors for Photoelectrolysis", Ann Rev. Mater. Sci., 1978, 8:99-134.
Haxel et al., "Rare Earth Elements—Critical Resources for High Technology", U.S. Geological Survey Fact Sheet, 087-02, 2002, p. 3.
Hochbaum et al., "Controlled Growth of Si Nanowire Arrays for Device Integration", Nano Letters, 2005, vol. 5, No. 3, 457-460.
Hopkins et al., "Impurity Effects in Silicon for High Efficiency Solar Cells", Journal of Crystal Growth 75 (1986) 67-79.
Huang et al., "Fabrication of Silicon Nanowire Arrays with Controlled Diameter, Length, and Density", Advanced Materials, 19, 744-748 (2007).
Huynh et al., "Hybrid Nanorod-Polymer Solar Cells", Science, 295, 2425 (2002).
Ismail et al., "Hydrogen Gas Production for Electronic-Grade Polycrystalline Silicon Growth", IEEE ICSE, 2002, 53-56.
Jacoboni et al., "A Review of Some Charge Transport Properties of Silicon", Solid State Electronics, 1977, vol. 20, 77-891.
Jenny et al., "Semiconducting Cadmium Telluride", Physical Review, vol. 96, No. 5, Dec. 1, 1954, 1190-1191.
Jung et al., "Aligned Carbon Nanotube-Polymer Hybrid Architectures for Diverse Flexible Electronic Applications", Nano Letters, 2006, vol. 6, No. 3, pp. 413-418.
Kang et al., "Hybrid solar cells with vertically aligned CdTe nanorods and a conjugated polymer", Applied Physics Letters, 86, Issue 11, 113101-1-113101-3 (2005).
Kawano et al., "Fabrication and properties of ultrasmall Si wire arrays with circuits by vapor-liquid-solid growth", Sensors and Actuators, a 97-98 (2002) 709-715.
Kayes et al., "Comparison of the device physics principles of planar and radial p-n junction nanorod solar cells", Journal of Applied Physics, 2005, 97:114302.1-114302.11.
Kayes et al., "Radial PN Junction Nanorod Solar Cells: Device Physics Principles and Routes to Fabrication in Silicon", IEEE PVSC, 2005, pp. 55-58.
Kayes et al., "Synthesis and Characterization of Silicon Nanorod Arrays for Solar Cell Applications", IEEE Wcpec, 2006, 1, 221-224.

(56) References Cited

OTHER PUBLICATIONS

Kayes et al., "Growth of vertically aligned Si wire arrays over large areas (>1cm2) with Au and Cu Catalysts", Supplementary Material, App. Phys. Letter, 91, 103110 (2007).

Kelzenberg et al., "Photovoltaic Measurements in Single-Nanowire Silicon Solar Cells", Nano Letters, 2008, vol. 8, No. 2, pp. 710-714.

Kim et al., "Stretchable and Foldable Silicon Integrated Circuits", Science, 2008, 320, 507-511.

Kim, Do Weon, International Search Report and Written Opinion, PCT/US2013/021339, Korean Intellectual Property Office, Date of Mailing: Apr. 29, 2013.

Klein et al., "Electrochemcial Fabrications of Cadmium Chalcogenide Microdiode Arrays", Chem. Mater., 1993, 5, 902-904.

Kressin et al., "Synthesis of Stoichiometric Cadmium Selenide Films via Sequential Monolayer Electrodeposition", Chem. Mater., 1991, 3, 1015-1020.

Lauhon et al., "Epitaxial core-shell and core-multishell nanowire heterostructures", Nature, vol. 420, Nov. 7, 2002, pp. 57-61.

Law et al., "Semiconductor Nanowires and Nanotubes", Annu. Rev. Mater. Res., 2004, 34:83-122.

Law et al., "Nanowire dye-sensitized solar cells", Nat. Mater., 2005, 4, 455-459.

Lee et al., "Solvent Compatibility of Poly(dimethylsiloxane)-Based Microfluidic Devices", Anal. Chem., 2003, 75, 6544-6554.

Lee, Dong Wook, International Search Report and Written Opinion, PCT/US2013/051413, Korean Intellectual Property Office, Oct. 24, 2013.

\* cited by examiner

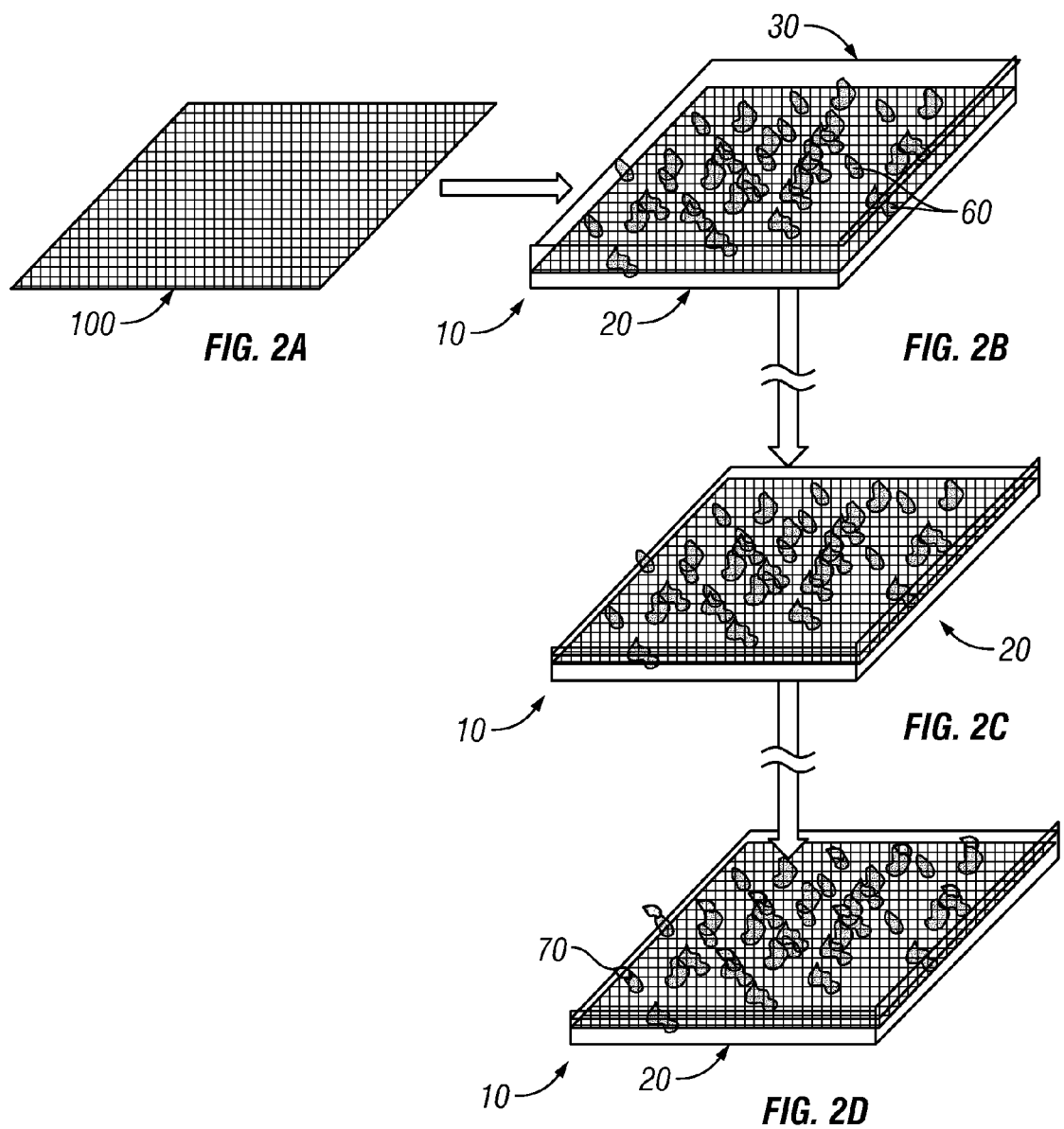

SOLAR FUEL GENERATOR

CROSS REFERENCE TO RELATED APPLICATIONS

The present application claims priority to U.S. Provisional Application No. 61/586,621, filed Jan. 13, 2012, the disclosure of which is incorporated herein by reference in its entirety.

STATEMENT REGARDING FEDERALLY SPONSORED RESEARCH

This invention was made with government support under DE-SC0004993 (T-105569) awarded by U.S. Department of Energy. The government has certain rights in the invention. The invention described herein was made in the performance of work under a NASA contract, and is subject to the provisions of Public Law 96-517 (35 USC 202) in which the Contractor has elected to retain title.

FIELD OF THE INVENTION

The disclosure relates to fuel cells and compositions useful for solar fuel cells. More specifically the disclosure provides conductive membranes useful for solar fuel generation and water splitting.

BACKGROUND

Sources and methods to generate alternatives to fossil fuels are becoming of more importance as demands for fossil fuels increase.

SUMMARY

This disclosure provides fabrication methodologies and materials to construct two distinct liquid water or water vapor-fed solar fuel generators. The disclosure describes components that can be added to existing technology and therefore do not describe specific features required to store solar-generated fuels or to connect the individual assemblies into large-area modular arrays as these technology are well known in the art, though it should be understood that these would be the preferred embodiments in a practical end-user application.

Aspects of an overall device of the disclosure comprise light absorbers, optical windows, catalysts, membranes and chassis.

The disclosure provides a membrane having a first surface and a second surface, comprising: (i) a polymer mesh coated with a conducting polymer (anionic or cationic conducting polymer), comprising a plurality of photoactive structures or (ii) a conducting polymer (anionic or cationic conducting polymer), comprising a plurality of photoactive structures, wherein the conducting polymer is adhered to the polymer mesh substrate to form the membrane, wherein the plurality of semiconductive/photoactive structures are embedded in the membrane, and wherein all or a subset of the structures embedded in the membrane extend entirely through the membrane. In one embodiment, a portion of the membrane is sufficiently free of embedded photoactive structures wherein this sufficiently free portion of the membrane allows for anion or cation conduction. In another embodiment, the polymer mesh is comprised of polyethylene, polypropylene, and/or nylon based materials. In yet a further embodiment, the polymer mesh has a pore size of 10 to 100 $\mu$m or more. In another embodiment, the conducting polymer is an ionomer. In a further embodiment, the ionomer is a sulfonated tetrafluoroethylene based fluoropolymer-copolymer. In another embodiment, the photoactive/semiconductive structures are comprised of a photoanodic based material. In a further embodiment, the photoanodic based material is selected from $TiO_2$, $SrTiO_3$, and/or chemically reduced $SrTiO_3$. In yet another embodiment, the first surface of the membrane comprising photoactive structures is coated with one or more hydrogen or oxygen evolution catalysts. In yet another embodiment, the hydrogen evolution catalyst includes catalytically active materials comprising one or more transition metals.

The disclosure also provides a chassis comprising the membrane described above in fluid contact with water on the first surface of the membrane, and the second surface of the membrane in light communication with a light source.

The disclosure also provides a method for producing a membrane of the disclosure, comprising suspending photoactive/semiconductive structures in a solution comprising a dissolved conducting polymer material; adhering the suspension to a polymer mesh; removing any surface coating on at least one or more surfaces of photoactive structures so that one or more surfaces of the structures are exposed on at least the first surface of the membrane. In a further embodiment, the method includes coating one or more of the surfaces of photoactive/semiconductive structures with one or more hydrogen or oxygen evolution catalysts. In yet another embodiment, the suspension is adhered to the polymer mesh by drying and/or heating. In one embodiment, the polymer mesh is comprised of polyethylene, polypropylene, and/or nylon based materials. In a further embodiment, the polymer mesh has a pore size of about 10 to 100 $\mu$m or more. In another embodiment, the dissolved conducting polymer material is an ionomer. In a further embodiment, the ionomer is sulfonated tetrafluoroethylene based fluoropolymer-copolymer. In yet another embodiment, the photoactive/semiconductive structures are photoanodic based materials, and wherein the suspension may further comprise single, double and/or triple junction based photoactive structures. In another embodiment, the method results in at least a portion of the membrane being sufficiently free of embedded photoactive structures.

No limitation is intended by the description of exemplary embodiments briefly described above or those described in additional detail below.

BRIEF DESCRIPTION OF THE DRAWINGS

FIG. 2A-D shows an additional structure of the membrane and a general method of manufacture.

DETAILED DESCRIPTION

Figure 1A:
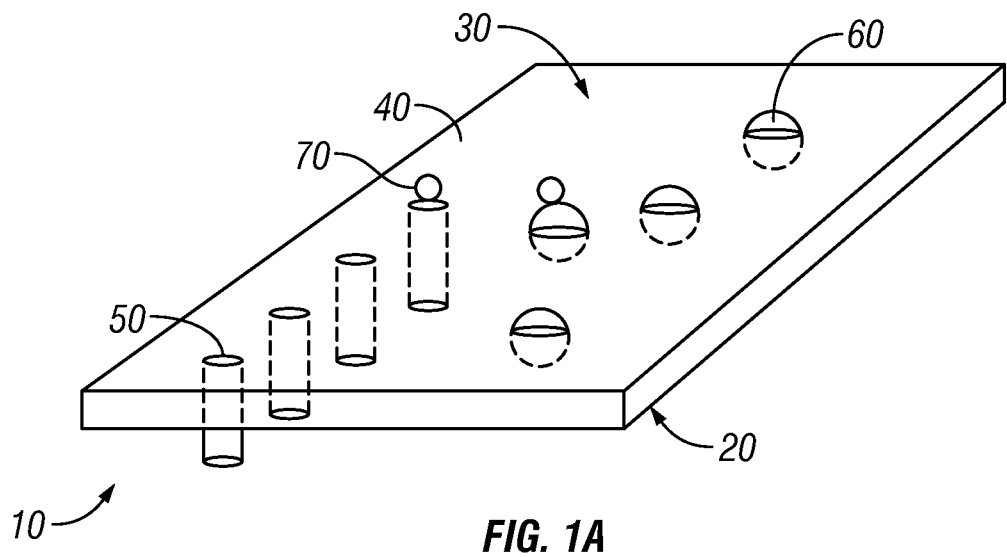
FIG. 1A-B shows general structures of a membrane of the disclosure.

As used herein and in the appended claims, the singular forms "a," "and," and "the" include plural referents unless the context clearly dictates otherwise. Thus, for example, reference to "a pillar" includes a plurality of such pillars and reference to "the particle" includes reference to one or more particles known to those skilled in the art, and so forth.

Also, the use of "or" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

By "about" is meant a quantity, level, value, number, frequency, percentage, dimension, size, amount, weight or length that varies by as much as 30, 25, 20, 25, 10, 9, 8, 7, 6, 5, 4, 3, 2 or 1% to a reference quantity, level, value, number, frequency, percentage, dimension, size, amount, weight or length.

With respect to ranges of values, the invention encompasses each intervening value between the upper and lower limits of the range to at least a tenth of the lower limit's unit, unless the context clearly indicates otherwise. Further, the invention encompasses any other stated intervening values. Moreover, the invention also encompasses ranges excluding either or both of the upper and lower limits of the range, unless specifically excluded from the stated range.

Unless defined otherwise, all technical and scientific terms used herein have the same meaning as commonly understood to one of ordinary skill in the art to which this disclosure belongs. Although methods and materials similar or equivalent to those described herein can be used in the practice of the disclosed methods and compositions, the exemplary methods, devices and materials are described herein.

The publications discussed above and throughout the text are provided solely for their disclosure prior to the filing date of the present application. Nothing herein is to be construed as an admission that the inventors are not entitled to antedate such disclosure by virtue of prior disclosure.

Within this description, the terms "wires," "rods," "whiskers," and "pillars" and other similar terms may be used synonymously, except as otherwise indicated. Generally, these terms refer to elongate structures which have lengths and widths, where the length is defined by the longest axis of the structure and the width is defined by the axis generally normal to the longest axis of the structure. The term "aspect ratio" refers to the ratio of a structure's length to its width. Hence, the aspect ratios of the elongate structures will be greater than one. The terms "ball," "spheroid," "blob" and other similar terms may also be used synonymously, except as otherwise indicated. Generally, these terms refer to structures with the width defined by the longest axis of the structure and the length defined by the axis generally normal to the width. Hence, the aspect ratio of such structures will generally be unity or less than unity. Further the term "vertical" with reference to wires, rods, whiskers, pillars, etc., generally refers to structures that have a length direction that is elevated somewhat from horizontal. The term "vertical alignment" generally refers to an alignment or orientation of a structure or structures that is elevated from horizontal. The structure or structures do not have to be completely normal to horizontal to be considered to have a vertical alignment. The term "array" generally refers to multiple numbers of structures distributed within an area and spaced apart, unless otherwise indicated. Structures within an array all do not have to have the same orientation. The terms "vertically aligned array" or "vertically oriented array" generally refer to arrays of structures where the structures have orientations elevated from a horizontal orientation up to orientations completely normal to a horizontal orientation, but the structures within the array may or may not have all the same orientations with respect to horizontal. The term "ordered" generally refers to the placement of elements in a specified or predetermined pattern where the elements have distinct spatial relationships to one another. Hence, the term "ordered array" generally refers to structures distributed within an area with distinct, specified or predetermined spatial relationships to one another. For example, the spatial relationships within an ordered array may be such that the structures are spaced apart from one another by generally equal distances. Other ordered arrays may use varying, but specified or predetermined, spacings.

Within this description, the term "semiconductor" or "photoactive material" is generally used to refer to elements, structures, or devices, etc. comprising materials that have semiconductive properties, unless otherwise indicated. Such materials include, but are not limited to: elements from Group IV of the periodic table: materials including elements from Group IV of the periodic table; materials including elements from Group III and Group V of the periodic table; materials including elements from Group II and Group VI of the periodic table; materials including elements from Group I and Group VII of the periodic table; materials including elements from Group IV and Group VI of the periodic table; materials including elements from Group V and Group VI of the periodic table; and materials including elements from Group II and Group V of the periodic table. Other materials with semiconductive properties may include: layered semiconductors; miscellaneous oxides; some organic materials, and some magnetic materials. The term "semiconductor structure" or "photoactive structure" refers to a structure consisting of, at least in part, semiconductor material. A semiconductor structure may comprise either doped or undoped material. As used herein and throughout the disclosure a semiconductive material (sometimes referred to as photoactive material) can be selected from the group consisting of $TiO_2$, $CaTiO_3$, $SrTiO_3$, $Sr_3Ti_2O_7$, $Sr_4Ti_3O_{10}$, $Rb_2La_2Ti_3O_{10}$, $Cs_2La_2Ti_3O_{10}$, $CsLa_2Ti_2NbO_{10}$, $La_2TiO_5$, $La_2Ti_3O_9$, $La_2Ti_2O_7$, $La_2Ti_2O_7$:Ba, $KaLaZr_{0.3}Ti_{0.7}O_4$, $La_4CaTi_5O_{17}$, $KTiNbO_5$, $Na_2Ti_6O_{13}$, $BaTi_4O_9$, $Gd_2Ti_2O_7$, $Y_2Ti_2O_7$, $ZrO_2$, $K_4Nb_6O_{17}$, $Rb_4Nb_6O_{17}$, $Ca_2Nb_2O_7$, $Sr_2Nb_2O_7$, $Ba_5Nb_4O_{15}$, $NaCa_2Nb_3O_{10}$, $ZnNb_2O_6$, $Cs_2Nb_4O_{11}$, $La_3NbO_7$, $Ta_2O_5$, $KsPrTa_5O_{15}$, $K_3Ta_3Si_2O_{13}$, $K_3Ta_3B_2O_{12}$, $LiTaO_3$, $KTaO_3$, $AgTaO_3$, $KTaO_3$:Zr, $NaTaO_3$:La, $NaTaO_3$:Sr, $Na_2Ta_2O_6$, $CaTa_2O_6$, $SrTa_2O_6$, $NiTa_2O_6$, $Rb_4Ta_6O_{17}$, $Ca_2Ta_2O_7$, $Sr_2Ta_2O_7$, $K_2SrTa_2O_7$, $RbNdTa_2O_7$, $H_2La_{2/3}Ta_2O_7$, $K_2Sr_{1.5}Ta_3O_{10}$, $LiCa_2Ta_3O_{10}$, $KBa_2Ta_3O_{10}$, $Sr_5Ta_4O_{15}$, $Ba_2Ta_4O_{15}$, $H_{1.8}Sr_{0.81}Bi_{0.19}Ta_2O_7$, Mg—Ta Oxide, $LaTaO_4$, $LaTaO_7$, $PbWO_4$, $RbWNbO_6$, $RbWTaO_6$, $CeO_2$:Sr, $BaCeO_3$, $NaInO_2$, $CaIn_2O_4$, $SrIn_2O_4$, $LaInO_3$, $Y_xIn_{2-x}O_3$, $NaSbO_3$, $CaSb_2O_6$, $Ca_2Sb_2O_7$, $Sr_2Sb_2O_7$, $Sr_2SnO_4$, $ZnGa_2O_4$, $Zn_2GeO_4$, $LiInGeO_4$, $Ga_2O_3^b$, $Ga_2O_3$:$Zn^c$, $Na_2Ti_3O_7$, $K_2Ti_2O_5$, $K_2Ti_4O_9$, $Cs_2Ti_2O_5$, $H^+$—$Cs_2Ti_2O_5$, $Cs_2Ti_5O_{11}$, $Cs_2Ti_6O_{13}$, $H^+$—$CsTiNbO_5$, $H^+$—$CsTi_2NbO_7$, $SiO_2$-pillared $K_2Ti_4O_9$, $SiO_2$-pillared $K_2Ti_{2.7}Mn_{0.3}O_7$, $Na_2W_4O_{13}$, $H^+$—$KLaNb_2O_7$, $H^+$—$RbLaNb_2O_7$, $H^+$—$CsLaNb_2O_7$, $H^+$—$KCa_2Nb_3O_{10}$, $SiO_2$-pillared $KCa_2Nb_3O_{10}$, ex-$Ca_2Nb_3O_{10}$/$K^+$ nanosheet[4]), Restacked ex-$Ca_2Nb_3O_{10}$/$Na^+$, $H^+$—$RbCa_2Nb_3O_{10}$, $H^+$—$CsCa_2Nb_3O_{10}$, $H^+$—$KSr_2Nb_3O_{10}$, $H^+$—$KCa_2NaNb_4O_{13}$. $Bi_2W_2O_9$, $Bi_2Mo_2O_9$, $Bi_4Ti_3O_{12}$, $BaBi_4Ti_4O_{15}$, $Bi_3TiNbO_9$, $PbMoO_4$, $(NaBi)_{0.5}MoO_4$, $(AgBi)_{0.5}MoO_4$, $(NaBi)_{0.5}WO_4$, $(AgBi)_{0.5}WO_4$, $Ga_{1.14}In_{0.86}O_3$, $\beta$-$Ga_2O_3$, $Ti_{1.5}Zr_{1.5}(PO_4)_4$, $WO_3$, $Bi_2WO_6$, $Bi_2MoO_6$, $Bi_2Mo_3O_{12}$, $Zn_3V_2O_8$, $Na_{0.5}Bi_{1.5}VMoO_8$, $In_2O_3$($ZnO)_3$, $SrTiO_3$:Cr/Sb, $SrTiO_3$:Ni/Ta, $SrTiO_3$:Cr/Ta, $SrTiO_3$:Rh, $CaTiO_3$:Rh, $La_2Ti_2O_7$:Cr, $La_2Ti_2O_7$:Fe, $TiO_2$: Cr/Sb, $TiO_2$:Ni/Nb, $TiO_2$:Rh/Sb, $PbMoO_4$:Cr, $RbPb_2Nb_3O_{10}$, $PbBi_2Nb_2O_9$, $BiVO_4$, $BiCu_2VO_6$, $BiZn_2VO_6$, $SnNb_2O_6$, $AgNbO_3$, $Ag_3VO_4$, $AgLi_{1/3}Ti_{2/3}O_2$, $AgLi_{1/3}Sn_{2/3}O_2$, $LaTiO_2N$, $Ca_{0.25}La_{0.75}TiO_{2.25}N_{0.75}$, TaON, $Ta_3N_5$, $CaNbO_2N$, $CaTaO_2N$, $SrTaO_2N$, $BaTaO_2N$, $LaTaO_2N$, $Y_2Ta_2O_5N_2$, $TiN_xO_yF_z$, $Sm_2Ti_2O_5S_2$ and La—In oxysulfide.

Figure 1B:
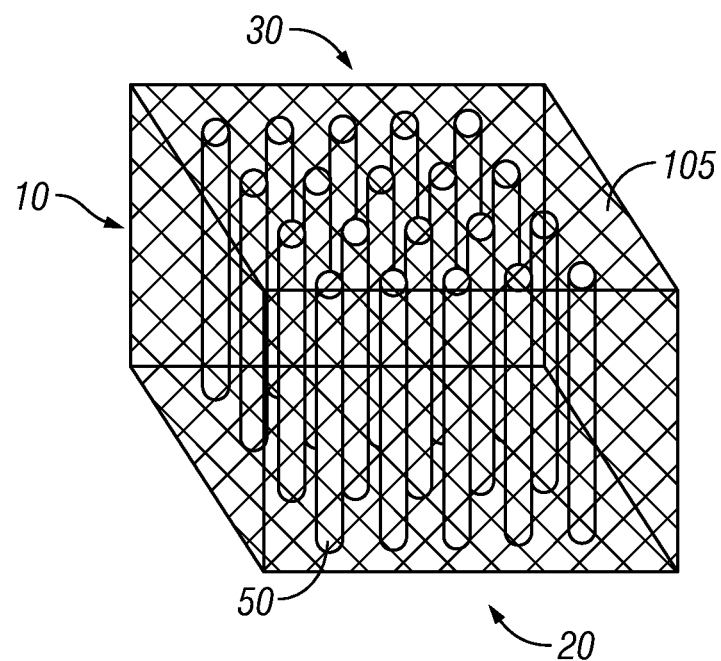

Turning to FIG. 1 a schematic diagram of a membrane of the disclosure is shown. Membrane 10 comprises a first surface 20 and a second surface 30. The overall dimensions of the membrane (length×width) can be modified by one of skill in the art for the intended use without undue experimentation. In some embodiments, a substrate may be used as starting point for the membranes formation to provide mechanical strength. However, the substrate is not required in embodiments where the ionomer membrane has sufficient mechanical strength. For example, the membrane may comprise a polymeric mesh substrate 100 (see FIG. 2); however in other embodiments (see, FIG. 1B) a polymeric mesh is not present. The membrane comprises a plurality of semiconductive structures 50 and/or 60 that are dispersed in the membrane. In one embodiment, some, but not all, of the semiconductive structures will extend through the first surface 20 and the second surface 30. The semiconductive structures 50 and 60 may be of any shape (e.g., globular, pillars, oval, spheroid, conical and the like). For example, FIG. 1 depicts semiconductive structure 50 as being substantially cylindrical and extending from/through the first surface 20 to/through second surface 30. In yet another embodiment depicted in FIG. 1 there are shown spherical semiconductive structures 60. Again, as with the cylinder structures of 50, the spherical structures 60 can extend beyond the first surface 20 and second surface 30 of membrane 10. Depending upon the consistency of the size of the semiconductive structure 50 and 60, some of the structures may not be of sufficient length, diameter or thickness to extend through both surfaces 20 and 30, but rather may extend through only one or neither of the surfaces. In one embodiment of the membrane 10, one or both surfaces are further contacted with a hydrogen or oxygen evolution catalyst 70. In some embodiments, the catalyst 70 will interact with semiconductive structures 50 or 60. FIG. 1B shows a further embodiment of pillars/wires 50 embedded in ionomeric membrane 105.

FIG. 2 shows additional embodiments of a membrane of the disclosure along with one embodiment of manufacturing the membrane. It should be noted that the process for membrane production can be carried out as a batch-wise method and can readily be adapted to commercial large scale roll-to-roll processes.

FIG. 2A shows a mesh substrate 100. The mesh substrate can comprise any suitable material that can support coating and polymerization of a conducting polymer material. For example, the mesh substrate 100 can be selected from polyethylene, polypropylene and nylon. The mesh substrate comprises pores that can be dimensioned for a particular semiconductive structure. For example, the pore size can be on the order of 10 to 100 μm or more. In addition, the mesh substrate 100 can be cut to a desired dimension. As mentioned above, however, the mesh is not necessary where the membrane has sufficient mechanical strength that is can be formed in the absence of the mesh. The mesh 100 is coated with a conducting polymeric suspension.

A conducting polymeric suspension is prepared containing a photoactive material/semiconductive material. As mentioned above, the photoactive material can be of any geometry and size. The conducting polymeric suspension comprises a material useful for forming an ionomer membrane. For example, the suspension can comprise a proton-conducting ionomer material selected from the group consisting of tetrafluoroethylene-fluorovinyl ether copolymers having sulphonic acid groups or a fluorine-free ionomer material selected from the group consisting of doped sulphonated polyether ketones, doped sulphonated or sulphinated aryl ketones, doped polybenzimidazoles and mixtures thereof.

The suspension comprising the suspended semiconductive material is then coated upon the mesh substrate 100. As shows in FIG. 2B, the mesh 100 is embedded within the conducting polymer material along with the photoactive/semiconductive structure 60; the mesh provides mechanical strength to the embodiment depicted in FIG. 2. For example, a suspension of photoanode particles (e.g. $H_2$-reduced $SrTiO_3$) or other photoactive/semiconductive structure 60 including single and double and triple junctions and other photoactive structures are prepared in a solution of dissolved conducting membrane material (e.g., Nafion®) and the suspension is aspirated, dip coated, or slurry coated onto the polymer mesh substrate 100. Typically, the conducting membrane solution has sufficient viscosity to produce a stable non-settling suspension with the photoactive/semiconductive structure 60. After coating, this membrane can be air dried followed by a mild heating step at about 120° C. for 2 hours to fully adhere the conducting membrane and photoactive/semiconductive structures to the polymer mesh substrate. In some embodiments, the conducting membrane is anion conducting and in others cation conducting. In other embodiments, wire arrays or other semiconductive/photoactive structures can be mechanically inserted into an ionomer membrane. In this embodiment, a pristine ionomer membrane is used (i.e., lacking semiconductive structures) and the semiconductive structures are then mechanically inserted into/through the membrane.

The relative mass of conducting membrane material and photoactive/semiconductive structures should be balanced to provide optimal free space for anion/cation conduction. The mass fraction of photoactive/semiconductive structures should be above the percolation threshold of about 25-50 wt % or greater to assure electronic conduction across the membrane, while leaving sufficient particle-free area to allow for anion/cation conduction to minimize polarization losses during operation.

The resulting conductive membrane 10 comprising photoactive/semiconductive material comprises a first surface 20 and second surface 30. As prepared, the photoactive/semiconductive structure 60 within the membrane will typically have a thin surface coating of the conducting membrane material, which can be, and should be, removed to expose the particles for coating with a hydrogen reduction catalyst or oxygen evolution catalyst. This selective removal of the thin conducting film from the photoactive/semiconductive structure 60 can be accomplished through a number of methods including a solvent wipe, mechanical abrasion with a fine abrasive, or a plasma etch.

Subsequent to polymerization and exposure of the photoactive/semiconductive structure 60, a layer of catalysts 70 is then coated on at least one surface (e.g., a second surface 30). The catalyst can be any number of catalysts useful as hydrogen or oxygen evolution. For example, suitable hydrogen evolution catalyst can be selected from the group consisting of Pt, Co, Cu, Fe, MoSx where x is nominally=2, but may be sub or super-stoichiometric, Ni, CoMo, CoW, FeMo, NiCo, NiFe, NiFeC, NiFeS, NiMnS, NiMo, NiMoP, NiSn, NiW, NiZn, NiZnP, CoNiFe, NiCoPMo, NiMoCo, NiMoCu, NiMoFe, NiMoW, NiSiMo, NiSiW and NiWPCu. Suitable oxygen evolution catalysts that can be used in the methods and composition of the disclosure can be selected from the group consisting of IrOx where x is nominally=2, but may be sub or super-stoichiometric, Pt, Co, Co/(PO$_4$)$^{3-}$, Co/(BO$_3$)$^{3-}$, CoP, Cu, Fe, Mn, Ni, Ni/(BO$_3$)$^{3-}$, NiP, Pb, CoFe, CoPSc$_2$O$_3$, FeMn, NiCo, NiCr, NiCu, NiFe, NiLa, NiLa, NiPSc$_2$O$_3$, NiSn, NiZn and NiMoFe. For example, the exposed photoactive/semiconductive structure 60 are then coated with a hydrogen reduction catalyst 70 such as Pt, or other catalysts that are needed to produce the desired fuels, on one or both sides of the photoactive/semiconductive structure 60 embedded in the membrane. This may be accomplished by a number of methods including sputter deposition, evaporation, screen printing, electroless deposition, electrodeposition, or photo-electrodeposition by way of immersing the hydrogen reduction side of the membrane in an aqueous Pt(II) or Pt(IV) solution and illuminating the opposite side to drive the photoelectrochemical deposition. The latter two approaches are useful since these techniques will selectively deposit the catalyst only at the exposed photoactive/semiconductive structure 60 sites, in contrast to sputter deposition, for example, which will deposit the catalyst unselectively across the photoanode particles as well as the conducting membrane.

As briefly described above the semiconductive/photoactive structures can be generated as particles, rods, whiskers, blobs, wires and various other structures, the dimensions of which can be controlled for various applications. For example, micro- and nano-particles of the foregoing can be generated using known methods (see, e.g., U.S. Pat. Publ. Nos.: 20130012636, 20130012650, 20120329888, 20120329209, 20120318168, 20120308630, 20120276389, the disclosure of which are incorporated herein by reference). Furthermore, methods of generating micro- and nano-wires comprising the foregoing are also known. For example, fabrication of vertically-aligned Si wire arrays from a Si wafer substrate is described. In one embodiment (as described more fully below), the wires can be embedded in a conducting polymer membrane. Various methods of growing wires are known. For example, to grow wires, an Si <111> wafer may be used as the material from which the semiconductor structures are grown. All or portions of the wafer may be doped. For example, a degenerately doped N-type Si wafer may be used. A surface oxide layer is thermally grown on the wafer. The surface oxide layer may be grown to a thickness of 285 nm, 300 nm, or other thicknesses. The oxide layer may also be deposited via chemical vapor deposition (CVD) or other methods known in the art. A photoresist layer is applied. The photoresist layer may comprise S1813 photoresist from MicroChem Corp. (Newton, Mass., USA) or other photoresist material. The photoresist layer is then exposed to a desired array pattern and developed with a developer to form a desired pattern of holes in the resist layer. The developer may comprise MF-319 or other developers known in the art. The patterned resist layer is then used to etch the oxide layer on the Si wafer. Etching of the oxide layer may be achieved by using hydrofluoric acid compositions such as buffered HF (9% HF, 32% NH$_4$F) from Transene Company, Inc. (Danvers, Mass., USA). Other etching techniques known in the art may also be used to etch the oxide layer. The result of the etching will be a pattern of holes in the oxide layer. A growth catalyst is then thermally evaporated onto the resist layer and into the holes in the oxide layer. For example, 500 nm of gold may be thermally evaporated onto the resist layer and into the holes. Other catalysts, such as, but not limited to, Cu, Pt or Ni, may also be used. Lift-off of the photoresist layer is then performed, leaving catalyst islands separated by the oxide in the oxide layer. The wafer with the patterned oxide layer and the deposited catalyst may then be annealed. Typically, the annealing is performed in a tube furnace at a temperature between 900 to 1000° C. or at a temperature of about 1050° C. for 20 minutes with the application of 1 atm of H$_2$ at a flow rate of 1000 sccm (where SCCM denotes cubic centimeters per minute at STP). Growth of wires on the wafer is then performed. The growth of wires in a wire array is accomplished through the application of a growth gas. Typically, the wires are grown in a mixture of H$_2$ (1000 sccm) and SiCl$_4$ (20 sccm) at about 1 atm. The wires may be grown for between 20 to 30 minutes at temperatures between 850° C. to 1100° C. or with different growth times, pressures, and or flow rates. After the fabrication of the semiconductor structures, a polymer mesh comprising pore sizes of about 10-100 μm or more is applied and/or a conductive polymer slurry is applied to encapsulate the semiconductor structures grown on the substrate. The polymer material is polymerized and then the removal of the encapsulated structures embedded in the polymer layer can be accomplished. Using this technique micro- or nano-wires can be obtained that extend through a proton conducting membrane from one surface of the membrane to the opposite surface of the membrane (see, e.g., FIG. 1B). Alternatively, the semiconductor structures are mechanically inserted into a pristine membrane.

Figure 3A:
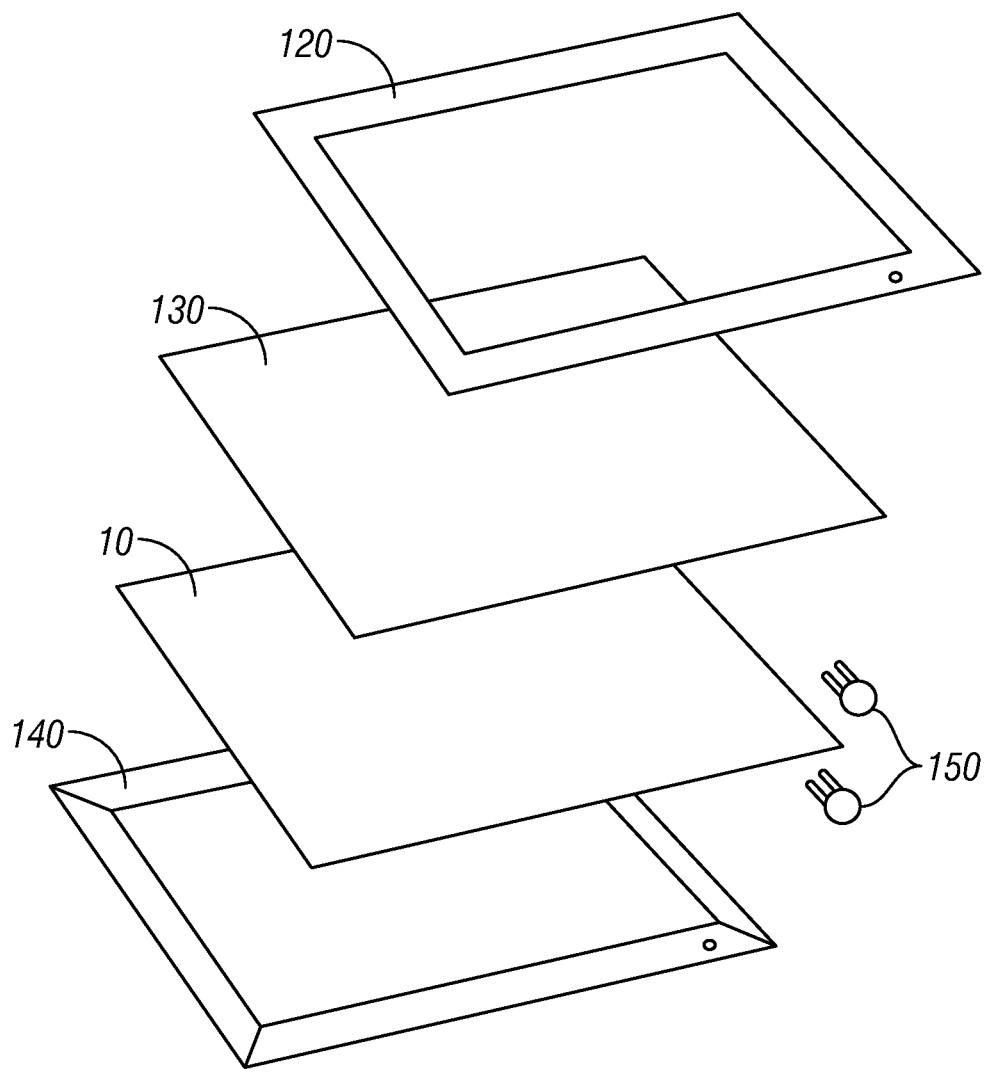
FIG. 3A-B shows a flow cassette comprising a membrane of the disclosure compartmentalizing two flow chambers.
Figure 3B:
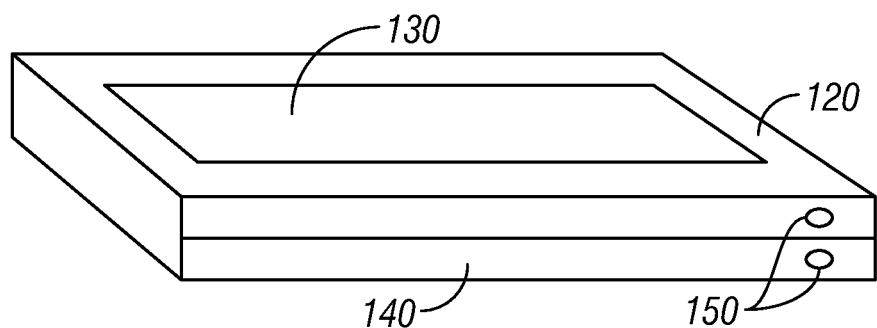

Once the water splitting membrane 10 is prepared, it can then be mounted inside a suitable chassis (see, e.g., FIG. 3A-B). Referring to FIG. 3A-B, a top frame 120 and bottom frame 140 will enclose and seal a UV transparent window 130 and membrane 10. Fill ports comprising threaded members 150 are present in both the top frame 120 and bottom frame 130. This may be initially fabricated using a three dimensional inkjet-style rapid prototyping Objet printer though in the typical embodiments it would be fabricated in more conventional low-cost polymer extrusion, casting, and/or stamping operations. The system will include a water feed port for continuous operation. A design feature is a simple and robust water-tight gas vent which consists of a hydrophobic membrane inserted as a gasket within the vent port. This membrane in its present design is a commercially available amorphous carbon/polytetrafluoroethylene (PFTE) binder membrane (Goretex) that allows the gases to be transported from the assembly while keeping the liquid water out of the gas vent. To deliver the product gas (H$_2$) or liquid (such as methanol) at practically high pressures for storage, a simple in-line check valve with a selectable release pressure is incorporated into the both product lines. Both check valves on the O$_2$ generation and H$_2$ generation sides must have the same release pressure to avoid pressure differentials across the two compartments which may damage the membrane.

The assembly can be sealed by a number of means including snap-tight connections between the top and bottom components, or by filling tongue-groove interfaces with commercially available fluoropolymer caulks such as Fluorodyn Viton-based caulks. The assembly can be fabricated with a slight tilt either in the membrane or the entire assembly to facilitate movement of the photogenerated gas bubbles away from the catalyst and light absorbing sites toward the gas vents. In another embodiment, the assembly can be fabricated with textured window to provide light focusing on the membrane. The membrane can also be modified to accept a water vapor rather than liquid water feed. This may be accomplished by re-depositing a thin conducting membrane onto the light absorber and catalyst particles to provide appropriate triple phase water molarity and pH and incorporating a passive water delivery system to maintain optimal membrane hydration such as a deliquescent salt (e.g. $ZnCl_2$) frit feed.

Figure 4:
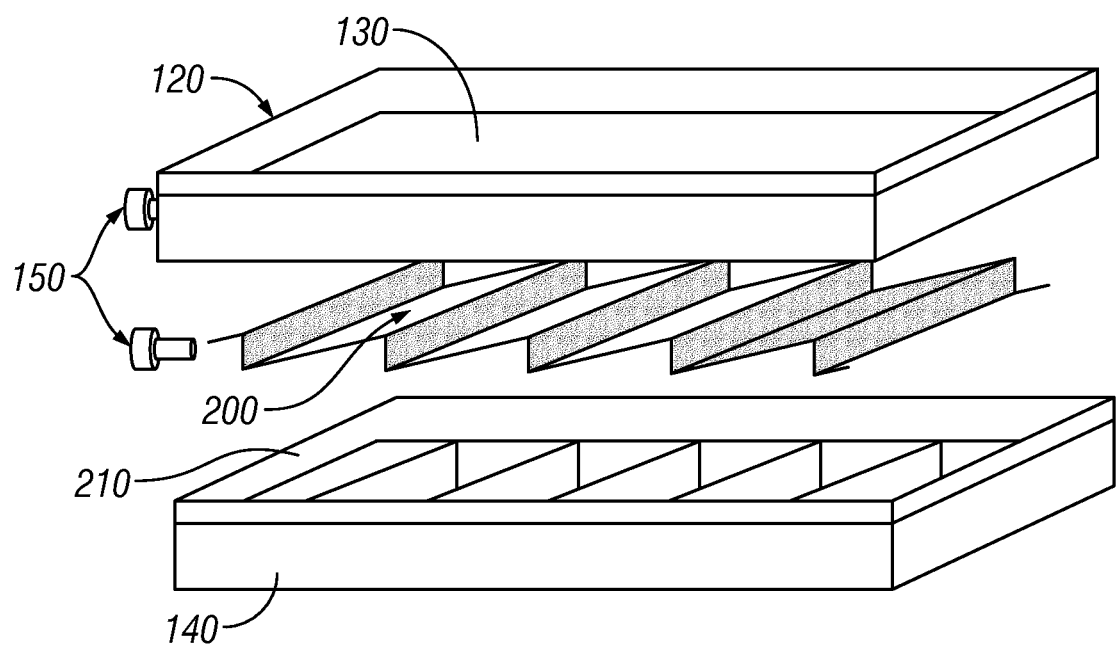
FIG. 4 shows another embodiment of a flow cassette wherein the membranes are depicted vertically, while still providing two flow chambers.

FIG. 4 shows yet another embodiment of a chassis for fuel generation. In this design, strips of photovoltaic cells of sufficiently high open circuit voltage necessary to support water electrolysis and associated overpotentials (for example, a triple junction amorphous Si or a dual junction $GaAs/Al_{1-x}Ga_xAs$) are mounted on a support structure at a slight angle 200. In order to limit corrosion of the photovoltaic cells in the electrolyte, the photovoltaic cell may incorporate protective films such that the photovoltaic cell is not in direct contact with the electrolyte. These films may be electronically conductive and transparent or semi-transparent to minimize light absorption on the illuminated side of the photovoltaic. The conductive transparent or semi-transparent film is typically fluorine doped tin oxide (SnO:F), but also may be selected from the group consisting of $In_2O_3$:Sn, $SnO_2$:Sb, $CdSnO_4$, TiN, ZnO:In, ZnO:Al, ZnO:B, ZnO:Ga, ZnO:F, ZnO:Al, $Zn_2SnO_4$, $ZnSnO_3$ and $Cd_2SnO_4$. On the photovoltaic side, the side that is not illuminated during operation, a transparent, semi-transparent, or fully opaque electronically conductive protective film may be incorporated. This film is typically tantalum, but may be any other metal, highly doped semiconductor, or conductive polymer recognized by those skilled in the art as resistant to corrosion. The light absorbing side of the photovoltaic strips can be coated with an oxygen evolution catalyst (e.g. $IrO_2$). The non-illuminated side of the photovoltaic is coated with a hydrogen reduction catalyst (e.g., Pt). The vertical portions of the assembly between the strips of photovoltaics 200 are conducting membranes 210. In this embodiment, the illuminated side of the assembly presents a 100% photovoltaic surface. That is, no orthogonally illuminated surface of the assembly is lost to the conducting membrane. The ratio of vertical conducting membrane 210 to slanted photovoltaic strips 200 can be varied to manage bubble transport away from the optically active and catalytic sites. However, the angle of slant of the photovoltaics 200 should be carefully balanced in that a large slant angle affords a large surface area for the conducting membrane (and hence low operational polarization losses) while conversely a large slant angle results in a concomitantly and undesirably large cavity resulting in significant light absorption within the water-filled cavity. Referring to FIG. 4, the photovoltaic/conducting membrane is prepared as above. The photovoltaic strips 200 are cut to the desired dimensions. And the light-exposed side of the photovoltaic strips 200 are coated with a very thin film or decorated with a small surface fraction of an oxygen evolution catalyst (e.g. $IrO_2$) by sputter deposition or electrodeposition, minimizing the thickness to limit attenuation of the incident light. The opposite side of the photovoltaic 200 is coated with a thin film of a hydrogen reduction catalyst (e.g., Pt). A frame is prepared consisting of vertical mesh uprights (pore size diameter ~100 μm) and struts for mounting the slanted photovoltaic strips 200. The vertical mesh uprights are then spray or dip coated with a solution of a conducting membrane material (e.g., Nafion®) to approximately 100 μm thickness. After coating, this membrane is air dried followed by a mild heating step at about 120° C. for 2 hours to fully adhere the membrane to the vertical mesh uprights. Alternatively, sheets of conducting membranes may be cut and mounted directly onto the vertical mesh uprights. The photovoltaic strips 200 are mounted on the slanted supports of the frame with commercially available fluoropolymer caulks such as Fluorodyn Viton-based caulks.

After preparation of the photovoltaic—conducting membrane structure, it is then mounted inside a suitable chassis comprising a top frame 120, transparent window 130 and bottom frame 140. This may be initially fabricated using a three dimensional inkjet-style rapid prototyping Objet printer though in the preferred embodiment it would be fabricated in more conventional low-cost polymer extrusion, casting, and/or stamping operations. The system will include a water feed port for continuous operation. One design feature is a simple and robust water-tight gas vent which consists of a hydrophobic membrane inserted as a gasket within the vent port. This membrane in its present design is a commercially available amorphous carbon/polytetrafluoroethylene (PFTE) binder membrane (Goretex) that allows the gases to be transported from the assembly while keeping the liquid water out of the gas vent. To deliver the product gas ($H_2$) at practically high pressures, a simple in-line check valve with a selectable release pressure are incorporated into the both product lines. The check valves on the $O_2$ generation and $H_2$ generation sides should have the same release pressure to avoid pressure differentials across the two compartments which may damage the membrane. The assembly can be sealed by a number of means including snap-tight connections between the top and bottom components, or by filling tongue-groove interfaces with commercially available fluoropolymer caulks such as Fluorodyn Viton-based caulks. The assembly can be fabricated with a slight tilt either in the photovoltaic-membrane or the entire assembly to facilitate movement of the photogenerated gas bubbles away from the catalyst and light absorbing sites toward the gas vents. The assembly can be fabricated with textured window to provide light focusing on the membrane. The assembly can also be modified to accept a water vapor rather than liquid water feed. This may be accomplished by depositing a thin conducting membrane onto both sides of the photovoltaic and catalyst particles to provide appropriate triple phase water molarity and pH and incorporating a passive water delivery system to maintain membrane hydration such as a deliquescent salt (e.g. $ZnCl_2$) frit feed.

What is claimed is:

1. A membrane comprising
a first surface and a second surface, the membrane comprising:
a polymer mesh coated with a conducting ionomeric polymer material, having a plurality of photoactive structures;
wherein the conducting ionomeric polymer material is adhered to the polymer mesh substrate to form the membrane,
wherein the plurality of photoactive structures are embedded in the membrane,
and wherein all or a subset of the structures embedded in the membrane extend entirely through the membrane.

2. The membrane of claim 1, wherein a portion of the membrane is sufficiently free of embedded photoactive structures; wherein this sufficiently free portion of the membrane allows for cation or anion conduction.

3. The membrane of claim 1, wherein the polymer mesh is comprised of polyethylene, polypropylene, and/or nylon based materials.

4. The membrane of claim 1, wherein the polymer mesh has a pore size of at least 100 μm.

5. The membrane of claim 1, where the ionomeric polymer material is a sulfonated tetrafluoroethylene based fluoropolymer-copolymer.

6. The membrane of claim 1, wherein the photoactive structures are comprised of a photoanodic based material.

7. The membrane of claim 6, wherein the photoanodic based material is selected from $TiO_2$, $SrTiO_3$, and/or chemically reduced $SrTiO_3$.

8. The membrane of claim 1, wherein a first surface of the membrane comprising photoactive structures is coated with one or more hydrogen reduction catalysts.

9. The membrane of claim 8, wherein the hydrogen reduction catalyst includes catalytically active materials comprising one or more transition metals.

10. A chassis comprising the membrane of claim 1 in fluid contact with water on the first surface of the membrane, and the second surface of the membrane with a hydrophobic liquid-tight gas permeable film.

* * * * *